United States Patent
Ottini et al.

(10) Patent No.: US 9,042,855 B1
(45) Date of Patent: May 26, 2015

(54) BASEBAND FILTER CALIBRATION METHODS AND SYSTEMS

(71) Applicant: Marvell International Ltd., Hamilton (BM)

(72) Inventors: Daniele Ottini, Pavia (IT); Alberto Pirola, Pavia (IT); Paolo Rossi, Pavia (IT); Marco Sosio, Pavia (IT); Antonio Liscidini, Toronto (CA); Rinaldo Castello, Arcore (IT)

(73) Assignee: MARVELL INTERNATIONAL LTD., Hamilton (BM)

( * ) Notice: Subject to any disclaimer, the term of this patent is extended or adjusted under 35 U.S.C. 154(b) by 0 days.

(21) Appl. No.: 14/177,862

(22) Filed: Feb. 11, 2014

Related U.S. Application Data (60) Provisional application No. 61/883,280, filed on Sep. 27, 2013.

(51) Int. Cl.
*H04B 17/00* (2006.01)
*H03K 5/00* (2006.01)
*H03D 7/14* (2006.01)

(52) U.S. Cl.
CPC .................................. *H03D 7/1483* (2013.01)

(58) Field of Classification Search
USPC ........ 327/551–559; 455/232.1, 130, 323–324
See application file for complete search history.

(56) References Cited

U.S. PATENT DOCUMENTS

| | | | | |
|---|---|---|---|---|
| 6,094,464 | A * | 7/2000 | Ebringer et al. | 375/342 |
| 7,376,400 | B2 * | 5/2008 | Bellaouar et al. | 455/130 |
| 2001/0021234 | A1 * | 9/2001 | Katayama et al. | 375/344 |
| 2006/0109939 | A1 * | 5/2006 | Ciccarelli et al. | 375/350 |

* cited by examiner

*Primary Examiner* — Dinh Le (57) ABSTRACT

Devices and methods capable of correcting for distortion are disclosed. For example, a method for compensating for non-idealities in a frequency-conversion circuit having a high-frequency input side separated from a baseband side by a passive mixer is presented. The method includes injecting a plurality of calibration signals in the baseband side to determine cross-talk between an In-phase (I) portion of the baseband side and a Quadrature (Q) portion of the baseband side to produce a first measurement $\Gamma_+$ and a second measurement $\Gamma_-$, synthesizing a crosstalk compensation filter $g(\omega)$ based on the first measurement $\Gamma_+$ and the second measurement $\Gamma_-$, and applying the crosstalk compensation filter $g(\omega)$ to an output of the frequency-conversion circuit.

20 Claims, 7 Drawing Sheets

BASEBAND FILTER CALIBRATION METHODS AND SYSTEMS

INCORPORATION BY REFERENCE

This application claims the benefit of U.S. Provisional Application No. 61/883,280 entitled "Compensation Algorithm for Baseband Filter Calibration" filed on Sep. 27, 2013, the content of which is incorporated herein by reference in its entirety.

BACKGROUND

Passive mixers are a highly desirable option when forming a mixer in a receiver. One drawback to using a passive mixer, however, is that passive mixers allow the components on each side (input and output) to interact. For example, an output impedance of a low noise amplifier (LNA) driving a passive mixer will interact with the input impedance of any filter coupled to the output of the mixer. As a result of such interaction, an ideal/desired transfer function of the filter(s) will be distorted from the ideal.

SUMMARY

Various aspects and embodiments of the invention are described in further detail below.

In an embodiment, a method for compensating for non-idealities in a frequency-conversion circuit having a high-frequency input side separated from a baseband side by a passive mixer is disclosed. The method includes injecting a plurality of calibration signals in the baseband side to determine cross-talk between an In-phase (I) portion of the baseband side and a Quadrature (Q) portion of the baseband side to produce a first measurement $\Gamma_+$ and a second measurement $\Gamma_-$, synthesizing a crosstalk compensation filter $g(\omega)$ based on the first measurement $\Gamma_+$ and the second measurement $\Gamma_-$, and applying the crosstalk compensation filter $g(\omega)$ to an output of the frequency-conversion circuit.

In another embodiment, a self-calibrating receiving circuit includes an amplifier with an input configured to be coupled to a high-frequency signal source and produce an amplified signal, a passive mixer coupled to an output of the amplifier and configured to split the amplified signal into an In-phase (I) signal at an I-signal output and a Quadrature (Q) signal at a Q-signal output, a first filter coupled to the passive mixer so as to receive the I-signal, a second filter coupled to the passive mixer so as to receive the Q-signal, signal injection circuitry configured to inject a first calibration signal followed by a second calibration signal into to first filter and the second filter so as to produce a first measurement signal $\Gamma_+$ followed by a second measurement signal $\Gamma_-$, and a crosstalk compensation filter $g(\omega)$ configured to remove crosstalk and coupled to an output of each of the I-signal output and the Q-signal output, the crosstalk compensation filter $g(\omega)$ being based on the first measurement $\Gamma_+$ and the second measurement $\Gamma_-$.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

The disclosed methods and systems below may be described generally, as well as in terms of specific examples and/or specific embodiments. For instances where references are made to detailed examples and/or embodiments, it is noted that any of the underlying principles described are not to be limited to a single embodiment, but may be expanded for use with any of the other methods and systems described herein as will be understood by one of ordinary skill in the art unless otherwise stated specifically.

One of the most significant disadvantages of a passive mixer is its inherit bilateral nature. That is, passive mixers allow for the coupling of devices attached to it. For this reason a load input impedance of a mixer can affect the operations of a low-noise amplifier (LNA) driving the mixer. This situation can lead to critical issue for a Receiver (RX) front-end design. That is, if the LNA output impedance has a reactive component, the Local Oscillator (LO) upper frequencies and the LO lower frequencies will show an asymmetric transfer function. This means that for a received Radio Frequency (RF) signal, a portion of it's In-phase (I) energy is down-converted to the Quadrature (Q) baseband and vice-versa. This effect is particularly evident in a Frequency Translatable Impedance (FTI) based front-end where the baseband transfer function shows an amplitude droop that has to be mandatorily fixed or else signal down-conversion cannot be performed properly. Another possible issue is that the LNA output impedance can affect the baseband transfer function shape.

Figure 1:
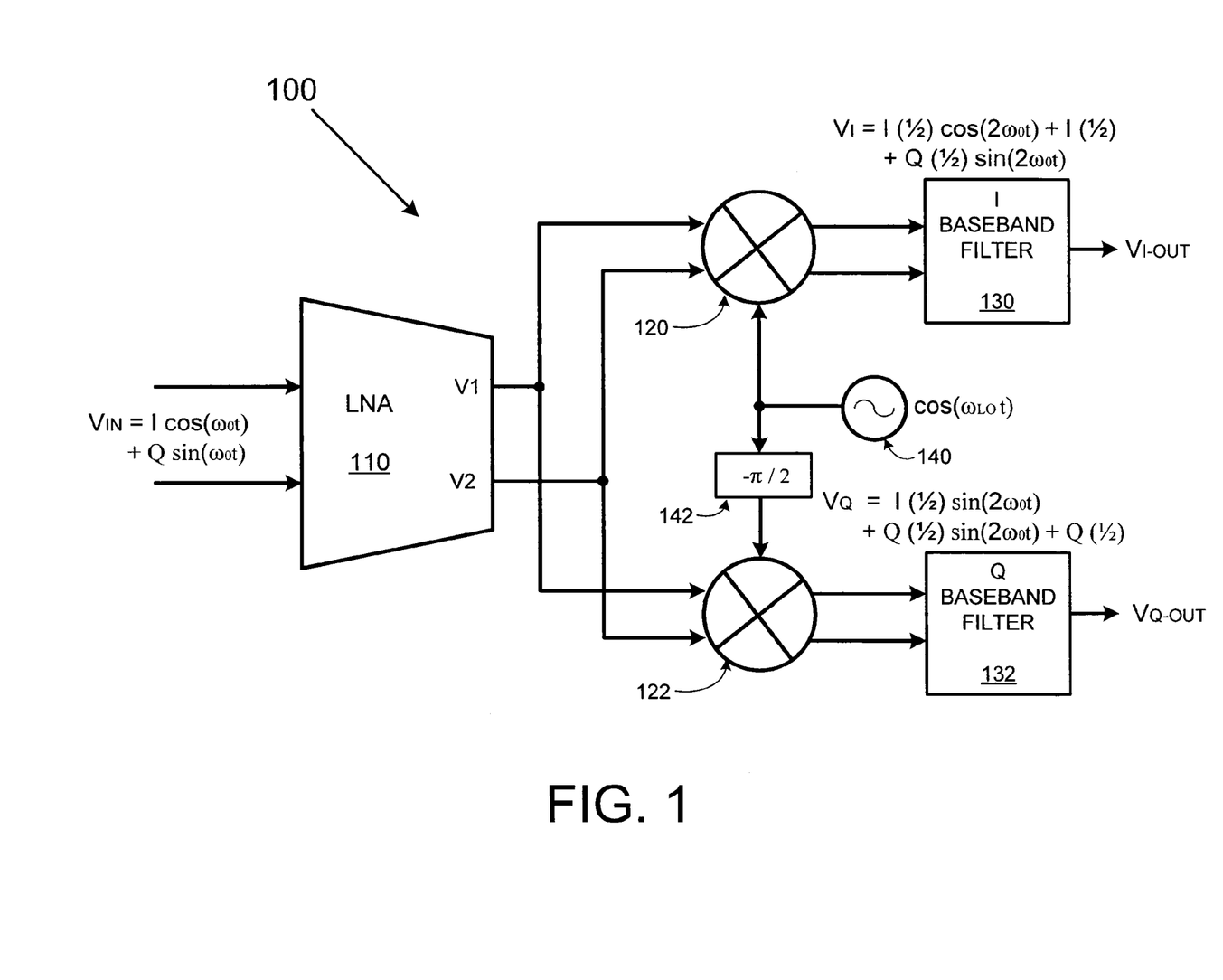
FIG. 1 is a block diagram of an example receiving circuit capable of producing a baseband signal from a high-frequency signal.

FIG. 1 is a block diagram of an example receiving circuit 100 capable of producing a baseband signal from a high-frequency signal, such as a cellular telephone communication signal. As shown in FIG. 1, the receiving circuit 100 includes a low-noise amplifier (LNA) 110, a first passive mixer 120, an I-baseband filter 130, a second passive mixer 122, a Q-baseband filter 132, a local oscillator (LO) 140 capable of producing a local oscillation signal $\cos(\omega_{LO} t)$, where $\omega_{LO}$ is the local oscillation frequency, and a phase shift device 142 capable of shifting the local oscillation signal $\cos(\omega_{LO} t)$ by $-\pi/2$ radians.

In operation, a high-frequency signal $V_{IN}$ is received and amplified by the LNA 110 so as to provide an amplified high-frequency signal to both the first passive mixer 120 and the second passive mixer 122.

The first passive mixer 120 receives the amplified high-frequency signal and the local oscillation signal $\cos(\omega_{LO} t)$, and mixes the amplified high-frequency signal to produce an I-phase signal $V_I$ according to the equation:

$$V_I = I(\tfrac{1}{2})\cos(2\omega_0 t) + I(\tfrac{1}{2}) + Q(\tfrac{1}{2})\sin(2\omega_0 t), \qquad \text{Eq.(1)}$$

Similarly, the second passive mixer 122 receives the amplified high-frequency signal and the local oscillation signal cos($\omega_{LO}$ t)(shifted by $-\omega/2$ radians), and mixes the amplified high-frequency signal to produce an Q-phase signal $V_Q$ according to the equation:

$$V_Q = I(\tfrac{1}{2})\sin(2\omega_0 t) + Q(\tfrac{1}{2}) + Q(\tfrac{1}{2})\sin(2\omega_0 t), \qquad \text{Eq.(2)}$$

The I-baseband filter 130 and the Q-baseband filter 132 then remove the high-frequency components such that only the I($\tfrac{1}{2}$) and Q($\tfrac{1}{2}$) components remain.

However, because the output of the LNA 110 can contain reactive components, such as parasitic capacitance and inductance, the $V_I$ and $V_Q$ signals will be contaminated with crosstalk such that a filtered output signal from the I-baseband filter 130 will produce an erroneous signal:

$$V_{I\text{-}OUT} = I(\tfrac{1}{2}) + errQ, \qquad \text{Eq.3}$$

where errQ represents crosstalk from the Q-channel, and a filtered output signal from the Q-baseband filter 132 will produce an erroneous signal:

$$V_{Q\text{-}OUT} = Q(\tfrac{1}{2}) + errI, \qquad \text{Eq.4}$$

where errI represents crosstalk from the I-channel.

Figure 2:
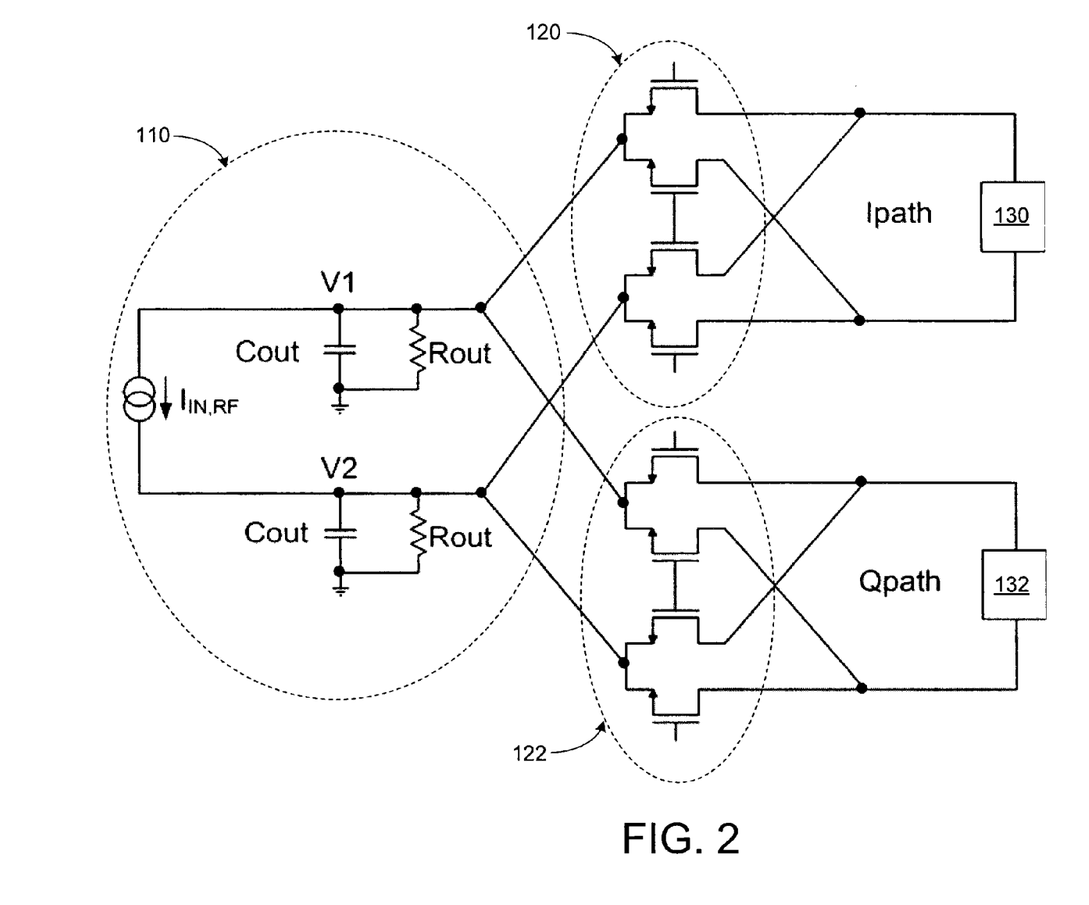
FIG. 2 depicts a circuit equivalent to the receiving circuit of FIG. 1.

FIG. 2 depicts a circuit model equivalent to the receiving circuit 100 of FIG. 1. As shown in FIG. 2, the outputs of LNA 110 contain a parasitic resistor $R_{OUT}$ and a parasitic capacitor $C_{OUT}$. Because the capacitor $C_{OUT}$ has memory, it is capable of producing a parasitic coupling between filters 130 and 132. The high-frequency input $Y_{IN}$ of FIG. 1 is represented by current source $I_{IN,RF}$, and as will be demonstrated below the current source $I_{IN,RF}$ can be alternatively modeled.

Figure 3:
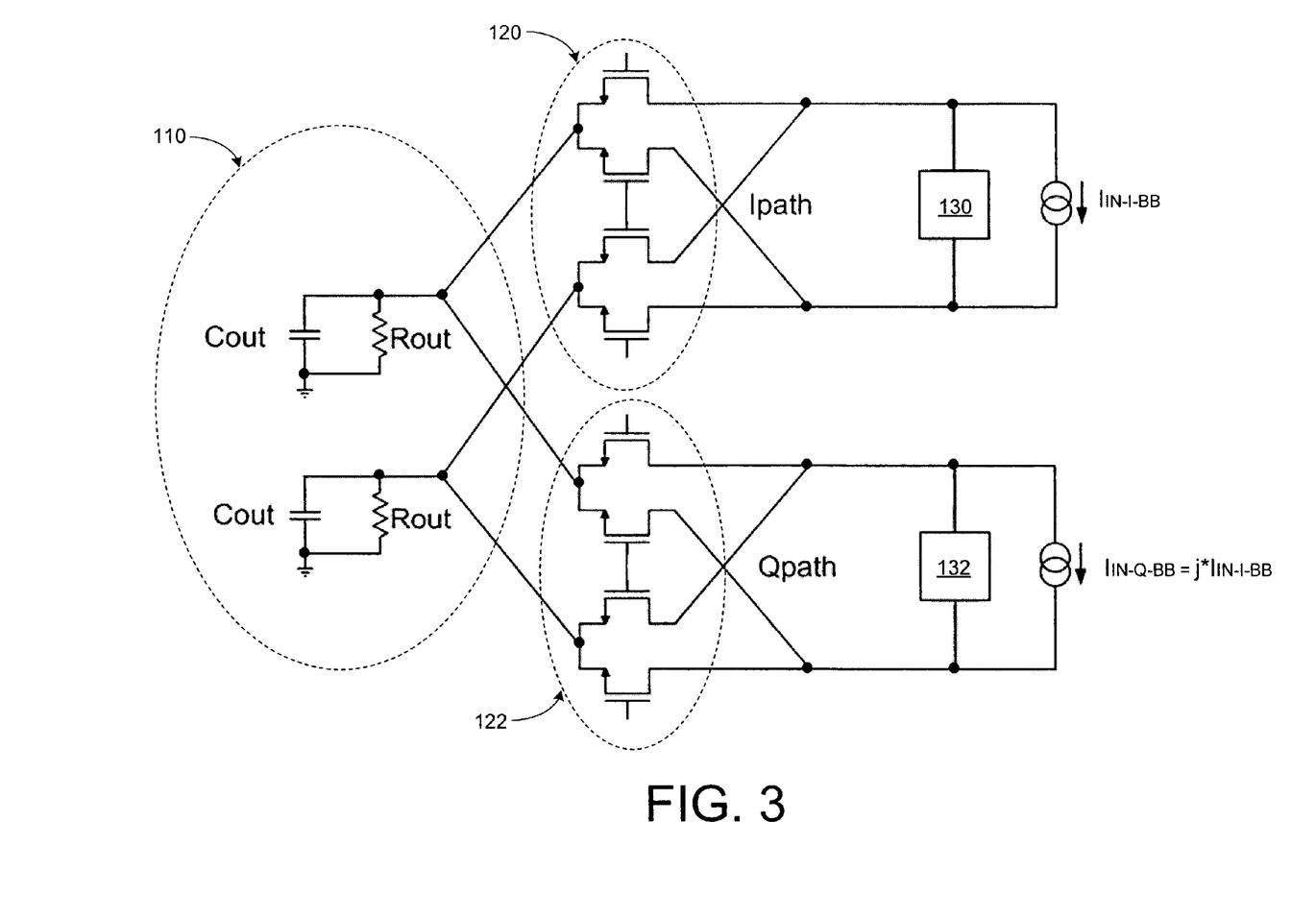
FIG. 3 depicts a modified circuit equivalent to the receiving circuit of FIG. 1 whereby equivalent input signals are injected into the baseband side of the passive mixer.

FIG. 3 depicts a modified circuit model equivalent to the receiving circuit of FIG. 1 whereby the high-frequency input current source $I_{IN,RF}$ is replaced by an I-side baseband current source $I_{IN\text{-}I\text{-}BB}$ and a Q-side baseband current source $I_{IN\text{-}Q\text{-}BB}$ (=$j^*I_{IN\text{-}I\text{-}BB}$). FIG. 3 demonstrates that, rather than inject a high-frequency signal (for example, in the gigahertz range) to test for parasitic crosstalk, it is possible to perform the same test using less expensive and more easily realized baseband signals (for example, in the megahertz range) injected in the baseband side of the passive mixers 120 and 122.

Figure 4:
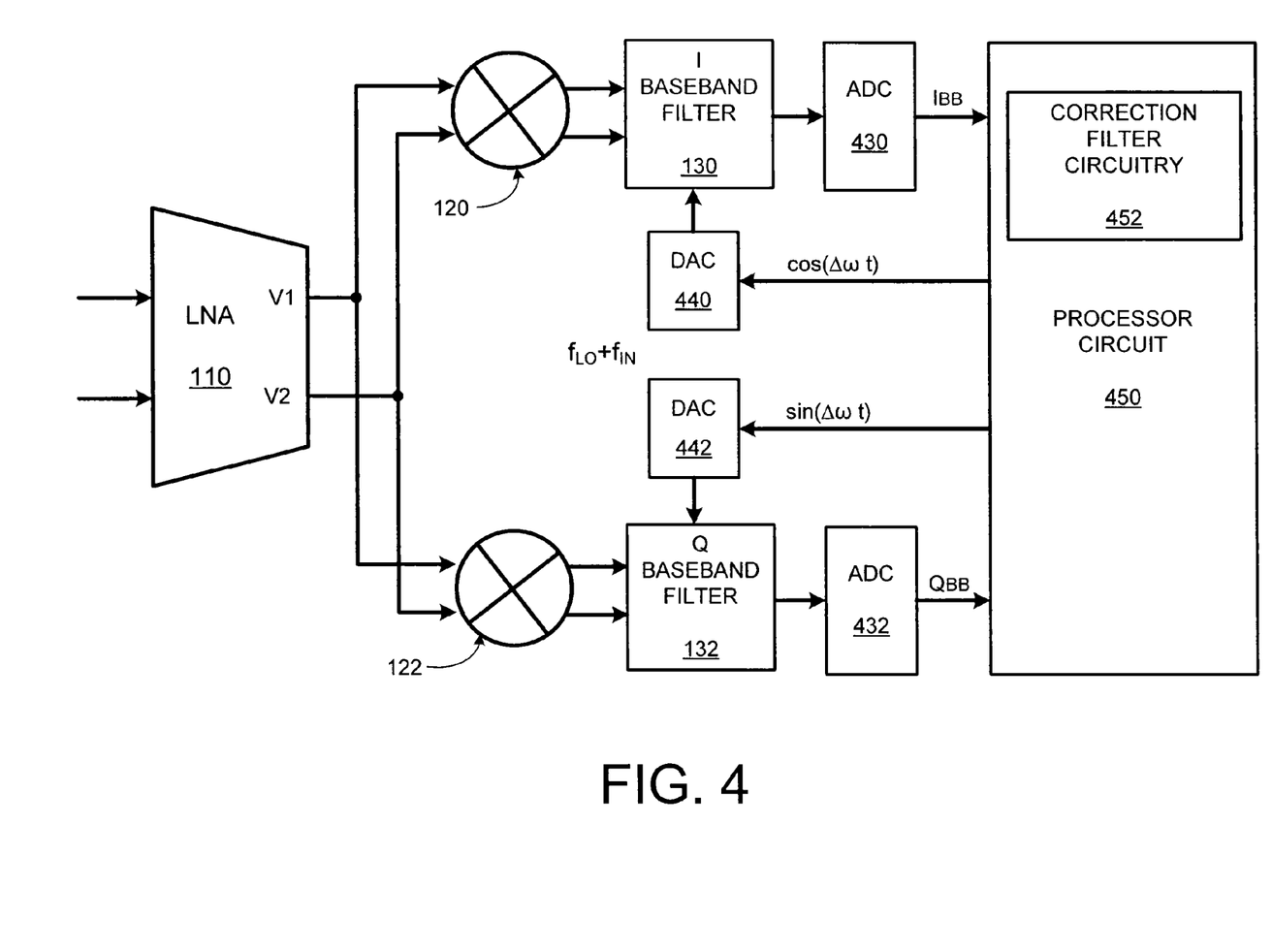
FIGS. 4-5 depict the receiving circuit of FIG. 1 modified so as to allow calibration signals to be injected into the baseband side of the passive mixer.
Figure 5:
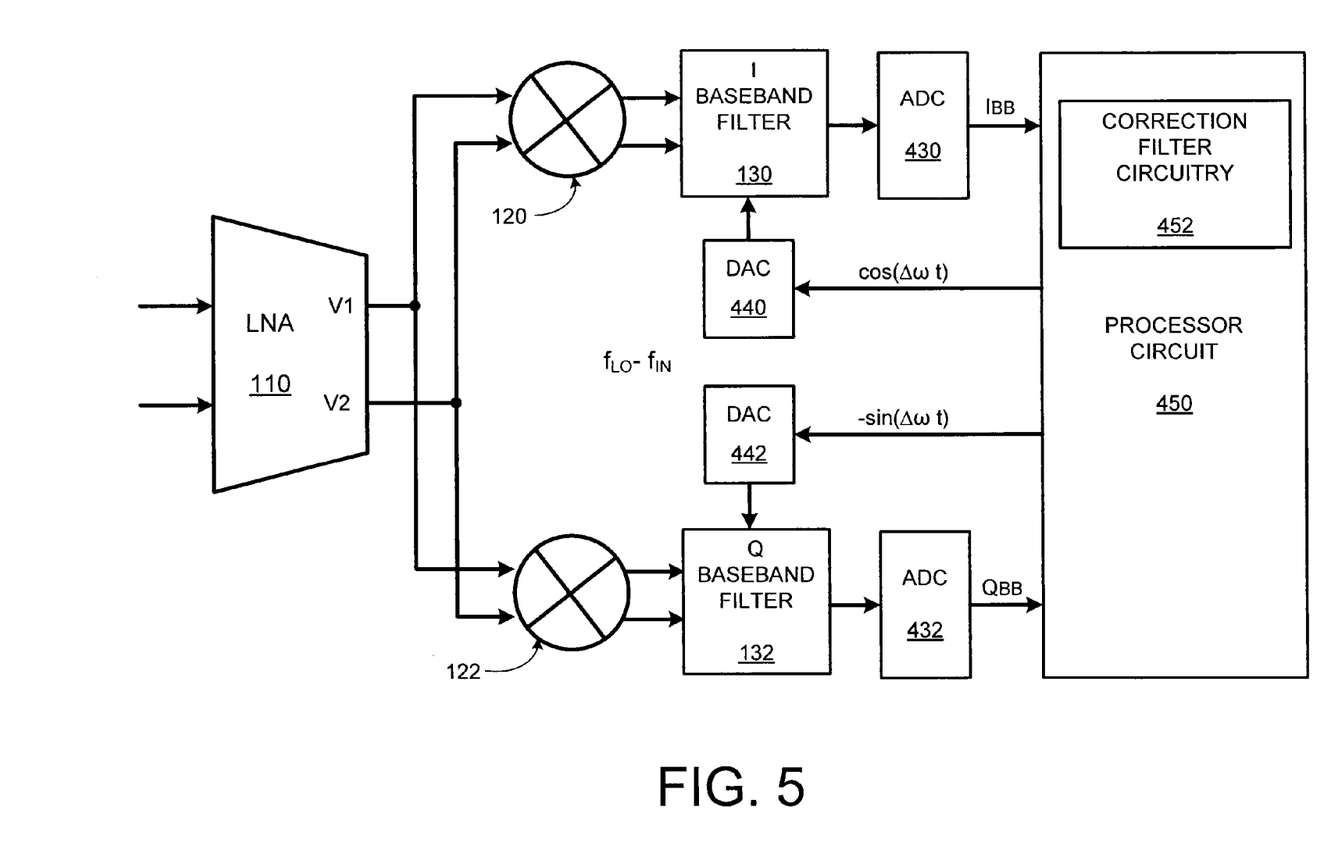

FIGS. 4-5 depict the receiving circuit 100 of FIG. 1 modified so as to allow calibration signals to be injected into the baseband side of the passive mixers 120 and 122. The local oscillator 140 and phase shift device 142 are removed from FIGS. 4-5 for clarity. As shown in FIG. 4, two analog-to-digital (ADC) converters 430 and 432 are appended to I-baseband filter 130 and the Q-baseband filter 132, respectively, with the output of the ADCs 430 and 432 provided to a processor circuit 450. Additionally, two digital-to-analog circuits (DACs) 440 and 442 are provided as signal injection circuitry to inject baseband signals from the processor circuit 450 into the I-baseband filter 130 and the Q-baseband filter 132, respectively.

In operation, DAC 440 injects a first calibration signal (cos($\Delta\omega$ t)) into the I-baseband filter 130 while DAC 442 injects a first complementary calibration signal (sin($\Delta\omega$ t)) into the Q-baseband filter 132. The term $\Delta\omega$ is equal to a desired test frequency, and injecting the cos($\Delta\omega$ t) signal into the I-baseband filter 130 and sin($\Delta\omega$ t) signal into the Q-baseband filter 132 is the equivalent of injecting a signal having a frequency $f_{LO}+f_{IN}$ into the input of the LNA 110. The frequency $\Delta\omega$ is a baseband frequency much less than frequency $\omega_{LO}$, where $\omega_{LO}$ is the local oscillator (LO) mixing frequency of the passive mixers 120 and 122. As the first calibration signals are injected, the ADCs 430 and 432 produce a first measurement $\Gamma_+$ to the processor circuit 450. Generally, $\Gamma(\omega)$ is the output circuit response for any given input to the LNA 110. For the purposes of this disclosure, the first measurement $\Gamma_+$ is the response expected when a signal having a frequency $f_{LO}+f_{IN}$ is fed into the input of the LNA 110.

Next, as shown in FIG. 5, DAC 440 injects a second calibration signal (cos($\Delta\omega$ t)) signal into the I-baseband filter 130 while DAC 442 injects a complementary second calibration signal ($-$sin($\Delta\omega$ t)) into the Q-baseband filter 132, which is the equivalent of injecting a signal having a frequency $f_{LO}-f_{IN}$ into the input of the LNA 110. As the second calibration signals are injected, the ADCs 430 and 432 produce a second measurement $\Gamma_-$ to the processor circuit 450. For the purposes of this disclosure, the second measurement $\Gamma_-$ is the response expected when a signal having a frequency $f_{LO}-f_{IN}$ is fed into the input of the LNA 110.

The processor circuit 450 then uses the first measurement $\Gamma_+$ and the second measurement $\Gamma_-$ to synthesize two different filters: a crosstalk compensation filter $g(\omega)$ and a transfer function correction filter $h(\omega)$. The correction filters are implemented by the correction filter circuitry 452 within the processor circuit 450. The architecture of the filters can be found in FIG. 6, which shows two crosstalk compensation filters $g(\omega)$, two summing junctions and two transfer function correction filters $h(\omega)$.

Figure 6:
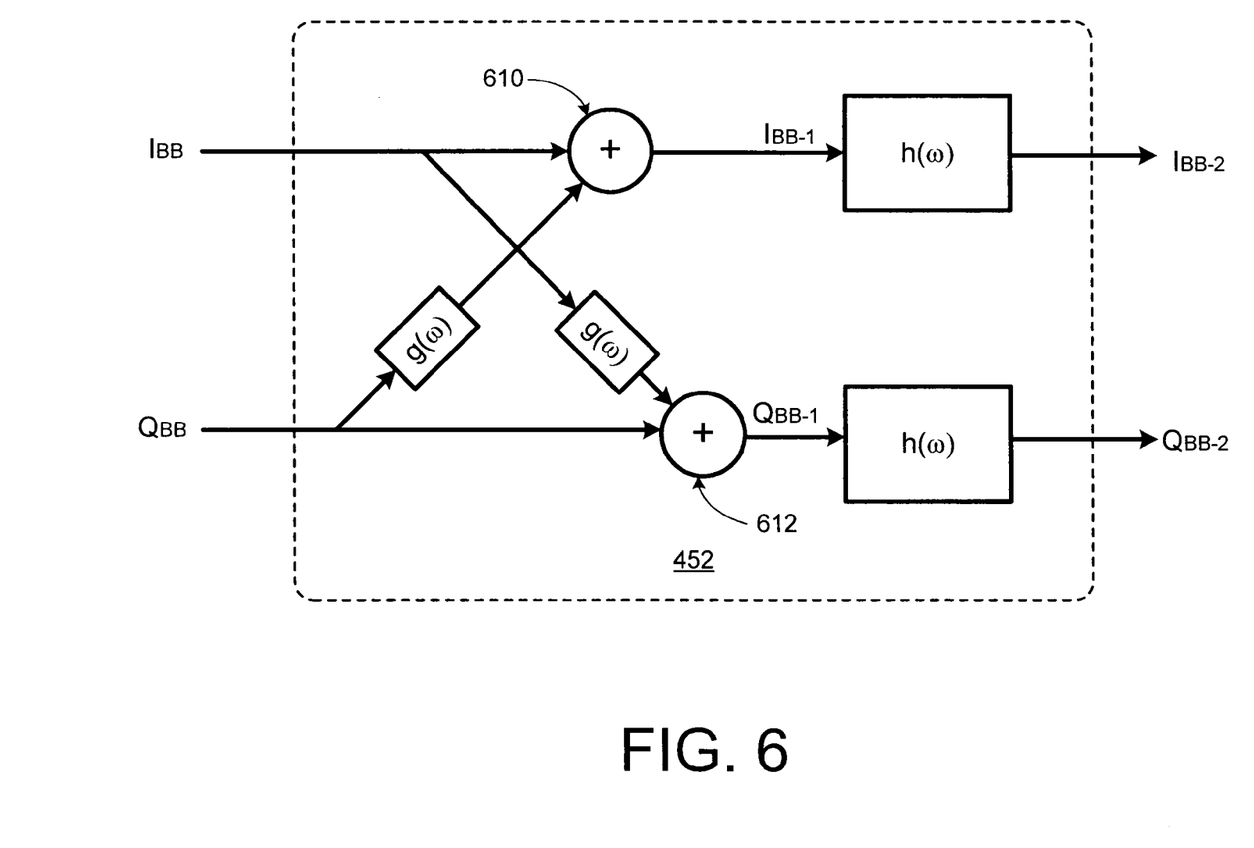
FIG. 6 depicts an architecture of filters useful to correct for parasitic crosstalk and non-idealities.

The parameters of the crosstalk compensation filter $g(\omega)$ are determined according to the formula:

$$g(\omega) = j\frac{\Gamma_-^* - \Gamma_+}{\Gamma_-^* + \Gamma_+}, \qquad \text{Eq. (5)}$$

where j is the square-root of $-1$, and $\Gamma_-^*$ is the complex conjugate of $\Gamma_-$.

The crosstalk compensation filter $g(\omega)$ can be synthesized as any type of filter. However, as the order of the crosstalk compensation filter $g(\omega)$ is likely to be no greater than two, the crosstalk compensation filter $g(\omega)$ is well synthesized as any type of biquad filter, such as a Tow-Thomson biquad filter, and take the general form:

$$g(\omega) = \frac{j\omega\dfrac{\text{Im}[Q]}{|Q|^2}}{-\omega^2 + j\omega\omega_0\dfrac{\text{Re}[Q]}{|Q|^2} + \omega_0^2}, \qquad \text{Eq. (6)}$$

where j is the square-root of $-1$, Q is a quality-factor of $\Gamma(\omega)$, and $\omega_0$ is the cut-off frequency of $\Gamma(\omega)$, assuming of $\Gamma(\omega)$ is a second-order low-pass function.

FIG. 6 depicts the correction filter circuitry 452 of FIGS. 4-5 useable to correct for parasitic crosstalk and non-idealities. As shown in FIG. 6, the correction filter circuitry 452 includes two crosstalk compensation filters $g(\omega)$, two summing junctions 610 and 612, and two transfer function correction filters $h(\omega)$. In operation, the crosstalk compensation filters $g(\omega)$ and summing junctions 610 and 612 are applied to the I-portion and the Q-portion of the baseband side according to the formulae:

$$I_{BB\text{-}1} = I_{BB} + g(\omega)Q_{BB} \qquad \text{Eq. (7)}$$

$$Q_{BB\text{-}1} = Q_{BB} + g(\omega)I_{BB} \qquad \text{Eq. (8)}$$

where $I_{BB}$ is an in-phase output of the passive mixer, $Q_{BB}$ is a quadrature output of the passive mixer, $I_{BB\text{-}1}$ is the in-phase output of the passive mixer compensated for crosstalk, and $Q_{BB\text{-}1}$ is the quadrature output of the passive mixer compensated for crosstalk.

The transfer function correction filters $h(\omega)$, which are also based on the first measurement $\Gamma_+$ and the second measurement $\Gamma_-$, are applied to the I-portion and the Q-portion of the baseband side according to the formulae:

$$I_{BB-2}=h(\omega)I_{BB-1} \qquad \text{Eq}9$$

$$Q_{BB-2}=h(\omega)Q_{BB-1} \qquad \text{Eq}10$$

where $I_{BB-2}$ is the in-phase output of the passive mixer compensated for non-idealities, and $Q_{BB-2}$ is the quadrature output of the passive mixer compensated for non-idealities.

As with the crosstalk compensation filters $g(\omega)$, the transfer function correction filters $h(\omega)$, can be synthesized with any number of filters, such as a biquad filter. Equation (11) below shows a non-limiting example useful for the transfer function correction filter $h(\omega)$:

$$h(\omega) = \frac{-\omega^2 + j\omega\frac{\omega_0}{Q_W} + \omega_0^2}{-\omega^2 + j\omega\frac{\omega_0}{Q_R} + \omega_0^2}, \qquad \text{Eq. (11)}$$

where $Q_W$ is the actual baseband quality factor taken from $g(\omega)$, and $Q_R$ is a target filter quality factor.

Figure 7:
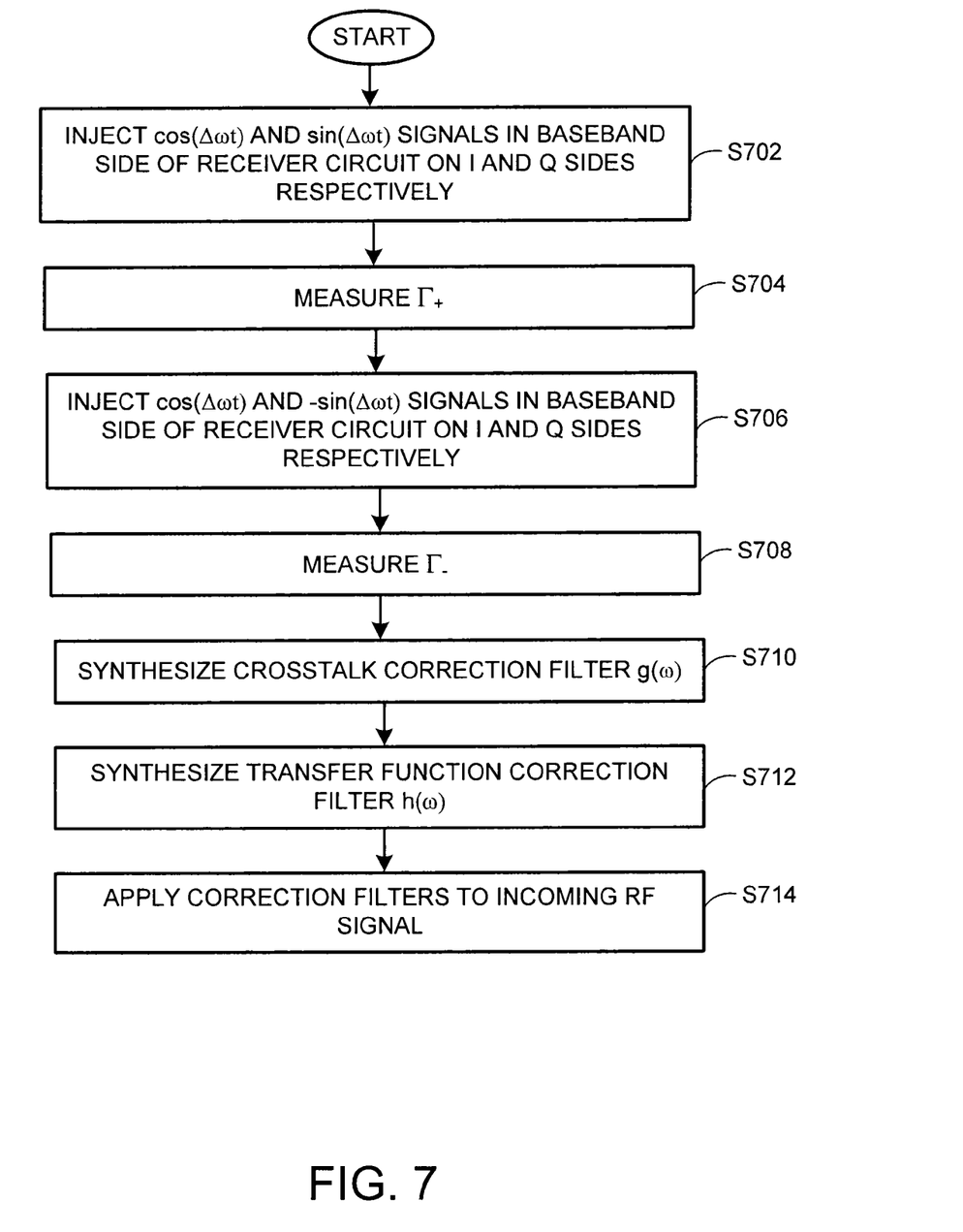
FIG. 7 is a flowchart outlining a set of example operations for providing compensating for a receiving circuit having a passive mixer.

FIG. 7 is a flowchart outlining a set of example operations for compensating for non-idealities in a frequency-conversion circuit having a high-frequency input side separated from a baseband side by a passive mixer, such as that shown in FIGS. 1-5 above. It is to be appreciated to those skilled in the art in light of this disclosure that, while the various functions of FIG. 10 are shown according to a particular order for ease of explanation, that certain functions may be performed in different orders or in parallel.

At S702, where a first calibration signal ($\cos(\Delta\omega\,t)$) is injected into an I-baseband filter while a complementary calibration signal ($\sin(\Delta\omega\,t)$) is injected into a Q-baseband filter—both baseband filters being located on the baseband side of a passive mixer. As discussed above, this acts as the equivalent of injecting a signal having a frequency $f_{LO}+f_{IN}$ into the input of an amplifier on the high-frequency input side of the passive mixer. Next, at S702 as the first calibration signals are injected, a first measurement signal $\Gamma_+$ can be measured at the output of the baseband filters. The process continues to S706.

At S706, a second calibration signal ($\cos(\Delta\omega\,t)$) is injected into the I-baseband filter while a complementary calibration signal ($\sin(\Delta\omega\,t)$) is injected into the Q-baseband filter. As discussed above, this acts as the equivalent of injecting a signal having a frequency $f_{LO}-f_{IN}$ into the input of an amplifier on the high-frequency input side of the passive mixer. Next, at S708 as the second calibration signals are injected, a second measurement signal $\Gamma_-$ can be measured at the output of the baseband filters. The process continues to S710.

At S710, a crosstalk compensation filter $g(\omega)$ is determined and synthesized based upon Equations (5) and (6) above using the first measurement signal $\Gamma_+$ and the second measurement signal $\Gamma_-$. Next, at S712, a transfer function correction filter $h(\omega)$ is determined and synthesized based upon Equation (11) above using, for example, the first measurement signal $\Gamma_+$, the second measurement signal $\Gamma_-$, and quality factor of the crosstalk compensation filter $g(\omega)$. Then, at S714 the crosstalk compensation filter $g(\omega)$ of S710 and the transfer function correction filter $h(\omega)$ are applied as shown in FIG. 6 and according to Equations (7) through (10) above.

While the invention has been described in conjunction with the specific embodiments thereof that are proposed as examples, it is evident that many alternatives, modifications, and variations will be apparent to those skilled in the art. Accordingly, embodiments of the invention as set forth herein are intended to be illustrative, not limiting. There are changes that may be made without departing from the scope of the invention.

What is claimed is:

1. A method for crosstalk compensating for non-idealities in a frequency-conversion circuit for separating a high input frequency from a baseband frequency by passive mixers coupled to a respective baseband filter, the method comprising:

injecting a plurality of calibration signals from a processor coupled to outputs of the respective baseband tiller to produce a first measurement and a second measurement at the outputs respectively;

synthesizing a crosstalk compensation filter $g(\omega)$ and a correction filter $h(\omega)$ based on the first measurement and the second measurement; and applying the correction filter $h(\omega)$ to an output of the frequency-conversion circuit.

2. The method of claim 1, wherein:

a first calibration signal of the plurality of compensation signals injected into the I-portion is $\cos(\Delta\omega t)$, where $\Delta\omega$ is a frequency of the first calibration signal that is less than $\omega_{LO}$, where $\omega_{LO}$ is a mixing frequency of the passive mixer; and a first complementary calibration signal injected into the Q-portion is $\sin(\Delta\omega t)$.

3. The method of claim 1, wherein:

a second calibration signal of the plurality of compensation signals injected into the I-portion is $\cos(\Delta\omega t)$; and a second complementary calibration signal injected into the Q-portion is $-\sin(\Delta\omega t)$.

4. The method of claim 1, wherein the crosstalk compensation filter $g(\omega)$ is synthesized as a biquad filter.

5. The method of claim 1, wherein the crosstalk compensation filter $g(\omega)$ is synthesized as a Tow-Thomson biquad filter.

6. The method of claim 1, wherein the compensation filter $g(\omega)$ is synthesized according to the formula:

$$g(\omega) = \frac{j\omega\frac{\text{Im}[Q]}{|Q|^2}}{-\omega^2 + j\omega\omega_0\frac{\text{Re}[Q]}{|Q|^2} + \omega_0^2}$$

where $j$ is the square-root of $-1$, $Q$ is a quality-factor of $g(\omega)$, and $\omega_0$ is a reference frequency for the quality factor.

7. The method of claim 1, wherein the crosstalk compensation filter $g(\omega)$ is applied to the Q-portion of the baseband side according to the formula:

$$I_{BB-1}=I_{BB}+g(\omega)Q_{BB},$$

where $I_{BB}$ is an in-phase output of the passive mixer, $Q_{BB}$ is a quadrature output of the passive mixer, and $I_{BB-1}$ is the in-phase output of the passive mixer compensated for crosstalk.

8. The method of claim 7, wherein the crosstalk compensation filter $g(\omega)$ is applied to the I-portion of the baseband side according to the formula:

$$Q_{BB-1}=Q_{BB}+=g(\omega)I_{BB},$$

where $Q_{BB-1}$ is the quadrature output of the passive mixer compensated for crosstalk.

9. The method of claim 1, wherein the compensation filter $g(\omega)$ is determined according to the formula:

$$g(\omega) = j\frac{\Gamma_-^* - \Gamma_+}{\Gamma_-^* + \Gamma_+}$$

where j is the square-root of −1, and $\Gamma_-^*$ is the complex conjugate of $\Gamma_-$.

10. The method of claim 1, further comprising:
synthesizing the transfer function correction filter $h(\omega)$ based on the first measurement and the second measurement; and
applying the transfer function correction filter $h(\omega)$ to the output of the frequency-conversion circuit according to the formulae:

$$I_{BB-2} = h(\omega)I_{BB-1},$$

where $I_{BB-2}$ is the in-phase output of the passive mixer compensated for non-idealities; and $$Q_{BB-2} = h(\omega)Q_{BB-1},$$

where $Q_{BB-2}$ is the quadrature output of the passive mixer compensated for non-idealities.

11. The method of claim 9, wherein the transfer function correction filter $h(\omega)$ is synthesized as a biquad filter using a quality (Q)-factor taken from $g(\omega)$.

12. The method of claim 10, wherein the transfer function correction filter $h(\omega)$ is synthesized according to the formula:

$$h(\omega) = \frac{-\omega^2 + j\omega\frac{\omega_0}{Q_W} + \omega_0^2}{-\omega^2 + j\omega\frac{\omega_0}{Q_R} + \omega_0^2}$$

where $Q_W$ is a first-stage output quality factor taken from $g(\omega)$, and $Q_R$ is a target filter quality factor.

13. The method of claim 1, further comprising:
synthesizing the transfer function correction filter $h(\omega)$ based on the first measurement and the second measurement; and
applying the transfer function correction filter $h(\omega)$ to the output of the frequency-conversion circuit.

14. The method of claim 12, wherein the transfer function correction filter $h(\omega)$ is synthesized as a biquad filter using a quality (Q)-factor taken from $\Gamma(\omega)$, where $\Gamma(\omega)$ is an output circuit response for any given input to the mixer.

15. The method of claim 12, wherein the transfer function correction filter $h(\omega)$ is synthesized according to the formula:

$$h(\omega) = \frac{-\omega^2 + j\omega\frac{\omega_0}{Q_W} + \omega_0^2}{-\omega^2 + j\omega\frac{\omega_0}{Q_R} + \omega_0^2}$$

where $Q_W$ is a first-stage output quality factor taken from $\Gamma(\omega)$, where $\Gamma(\omega)$ is an output circuit response for any given input to the mixer, and $Q_R$ is a target filter quality factor.

16. A self-calibrating receiving circuit, comprising
an amplifier with an input configured to be coupled to a high-frequency signal source and produce an amplified signal;
a mixer coupled to an output of the amplifier and configured to split the amplified signal into an In-phase (I) signal at an I-signal output, and a Quadrature (Q) signal at a Q-signal output;
a first filter coupled to the mixer so as to receive the I-signal;
a second filter coupled to the mixer so as to receive the Q-signal;
signal injection circuitry configured to inject a first calibration signal followed by a second calibration signal to first filter and the second filter so as to produce a first measurement signal followed by a second measurement signal; and
a crosstalk compensation filter $g(\omega)$ configured to remove crosstalk and coupled to an output of each of the I-signal output and the Q-signal output, the crosstalk compensation filter $g(\omega)$ being based on the first measurement and the second measurement.

17. The circuit of claim 16, wherein:
the first calibration signal includes an I-portion of $\cos(\Delta\omega t)$ injected into the first filter and a complementary Q-portion of $\sin(\Delta\omega t)$ injected into the second filter, where $\Delta\omega$ is a frequency of the first calibration signal that is less than $\omega_{LO}$, where $\omega_{LO}$ is a mixing frequency of the passive mixer; and
the second calibration signal includes an I-portion of $\cos(\Delta\omega t)$ injected into the first filter and a complementary Q-portion of $\sin(\Delta\omega t)$ injected into the second filter.

18. The circuit of claim 16, wherein the crosstalk compensation filter $g(\omega)$ is applied to the I-signal according to the formula:

$$I_{BB-1} = I_{BB} + g(\omega)Q_{BB},$$

where $I_{BB}$ is an in-phase output of the passive mixer, $Q_{BB}$ is a quadrature output of the passive mixer, and $I_{BB-1}$ is the in-phase output of the passive mixer compensated for crosstalk; and
the crosstalk compensation filter $g(\omega)$ is applied to the Q-portion of the baseband side according to the formula:

$$Q_{BB-1} = Q_{BB} + = g(\omega)I_{BB},$$

where $Q_{BB-1}$ is the quadrature output of the passive mixer compensated for crosstalk.

19. The method of claim 16, wherein the compensation filter $g(\omega)$ is determined according to the formula:

$$g(\omega) = j\frac{\Gamma_-^* - \Gamma_+}{\Gamma_-^* + \Gamma_+}$$

where j is the square-root of −1, and $\Gamma_-^*$ the complex conjugate of $\Gamma_-$.

20. The circuit of claim 16, further comprising:
a compensation filter $h(\omega)$ coupled to the output of the frequency-conversion circuit, the compensation filter $h(\omega)$ also based on the first measurement and the second measurement, and synthesized according to the formula:

$$h(\omega) = \frac{-\omega^2 + j\omega\frac{\omega_0}{Q_W} + \omega_0^2}{-\omega^2 + j\omega\frac{\omega_0}{Q_R} + \omega_0^2}$$

where $Q_W$ is a first-stage output quality factor taken from $g(\omega)$, and $Q_R$ is a target filter quality factor.

* * * * *